US005490038A

United States Patent [19]
Scholder et al.

[11] Patent Number: 5,490,038
[45] Date of Patent: Feb. 6, 1996

[54] ADAPTER APPARATUS FOR USE IN CONNECTING A PRINTED CIRCUIT BOARD TO A COMPUTER CHASIS

[75] Inventors: Erica Scholder, Austin; Gilberto Hernandez, Pflugerville, both of Tex.

[73] Assignee: Dell USA, L.P., Austin, Tex.

[21] Appl. No.: 223,913

[22] Filed: Apr. 6, 1994

[51] Int. Cl.⁶ ...................................................... H05K 5/00
[52] U.S. Cl. ........................... 361/759; 361/801; 361/796; 174/50; 248/121
[58] Field of Search ..................... 361/752, 796, 361/753, 754, 759, 801, 802, 796; 439/154; 248/65, 121, 122; 174/50; 206/334; 364/708

[56] References Cited

U.S. PATENT DOCUMENTS 5,038,308  8/1991  Le et al. ................................. 364/708
5,136,468  8/1992  Wong et al. ........................... 361/393
5,347,430  9/1994  Curlee et al. ......................... 361/816
5,398,161  3/1995  Roy ........................................ 361/727

Primary Examiner—Leo P. Picard
Assistant Examiner—Y. Whang
Attorney, Agent, or Firm—Richard Konnekan; James Huffman

[57] ABSTRACT

A generally plate-shaped adapter device has an inner edge portion with spaced bosses thereon that may be snapped into tooling holes in a printed circuit board which is smaller than the circuit board originally designed to be secured to mounting portions formed on a computer chassis wall. The in-place adapter device forms an outward edgewise extension of the smaller circuit board and has an outer edge portion positioned and configured to cooperate with the chassis board mounting structure in a manner permitting the reduced size printed circuit board to be operatively mounted on the chassis wall without modification of its board mounting structure.

15 Claims, 5 Drawing Sheets

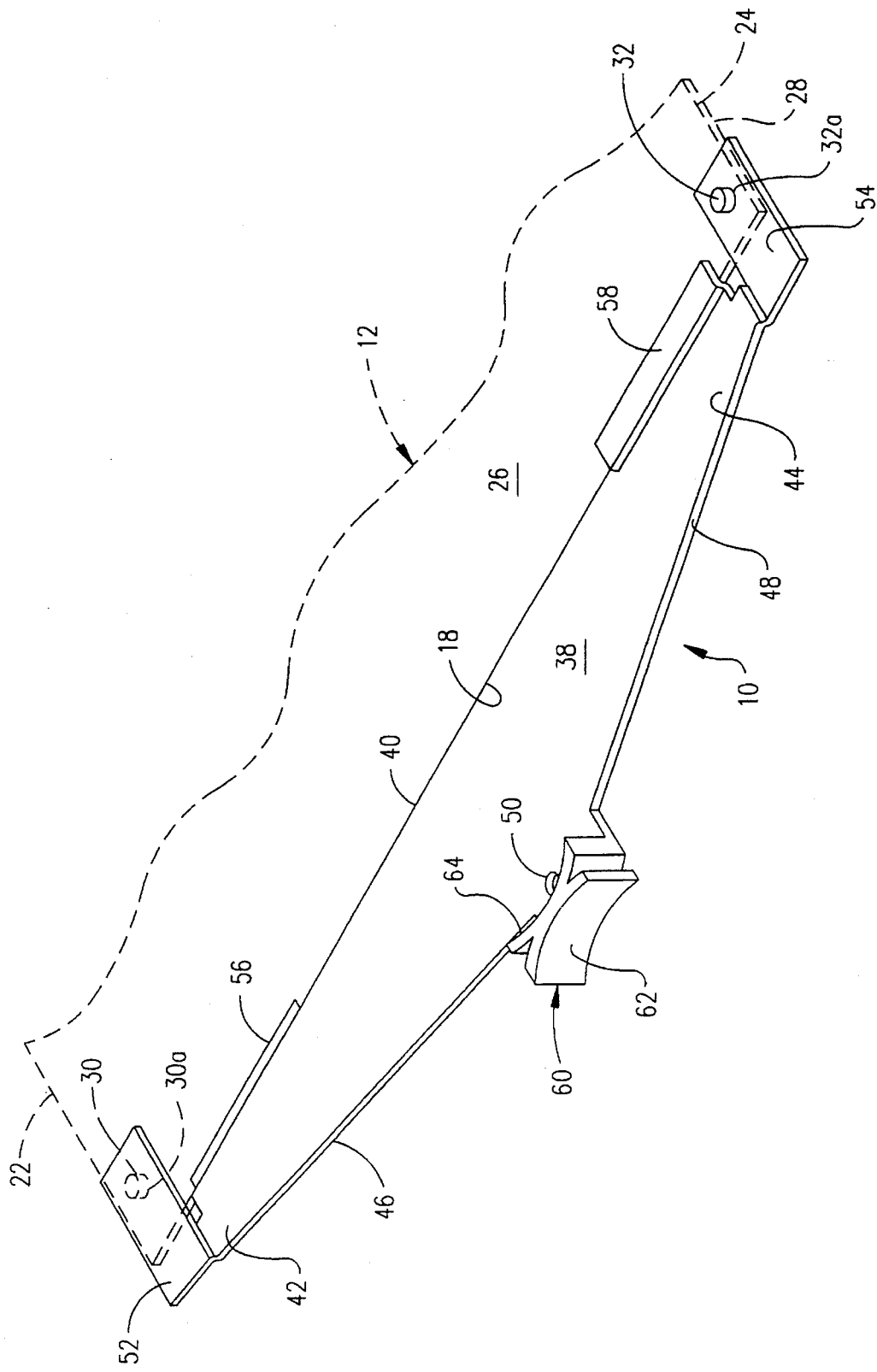

ADAPTER APPARATUS FOR USE IN CONNECTING A PRINTED CIRCUIT BOARD TO A COMPUTER CHASIS

BACKGROUND OF THE INVENTION

The present invention generally relates to the connection of printed circuit boards to associated chassis structures and, in a preferred embodiment thereof, more particularly relates to adapter apparatus for use in connecting a printed circuit board, such as a motherboard, to a computer chassis.

Two of the most expensive parts in a personal computer are its enclosure, or chassis, and its main system printed circuit board which is commonly referred to as a "motherboard". The ability to utilize a number of motherboard designs in conjunction with a single chassis design is a manufacturing necessity due to the time and expense involved in designing and developing a new chassis. Three or four new motherboard designs can typically be made ready for market in the time it customarily takes to develop a new chassis design.

Large cost savings can be achieved by decreasing the size of a motherboard even slightly. Due to the current rapid development in component miniaturization, increased chip function capabilities and manufacturing improvements that allow circuit board real estate to be more densely packed, opportunities for cost reductions from motherboard size decreases often arise several times during the production life of a given chassis design.

In order to take advantage of the cost savings arising from a motherboard size reduction, it has heretofore been necessary to revise the configuration of the original chassis, for example by relocating board mounting bosses or board lock structures on the chassis, to accommodate the smaller motherboard. The requirement for this chassis modification, of course, can undesirably offset a substantial portion of the cost savings achieved in the motherboard size reduction.

From the foregoing it can readily be seen that it would be highly desirable to provide apparatus and methods for permitting a single computer chassis to accommodate a reduction in the size of the motherboard that it was originally designed to operatively support without the necessity of altering the configuration of the chassis. It is accordingly an object of the present invention to provide such apparatus and methods.

SUMMARY OF THE INVENTION

In carrying out principles of the present invention, in accordance with a preferred embodiment thereof, a first printed circuit board, representatively a motherboard, is operatively secured to a computer chassis wall in place of second printed circuit board, larger in an edgewise direction than the first circuit board, using a specially designed extender device embodying principles of the present invention. The extender device representatively has a generally plate shaped configuration and is conveniently formed as a one piece plastic molding.

First mounting means are provided for releasably holding the extender device on the first printed circuit board in a manner such that the extender device forms an edgewise extension of the first printed circuit board. Illustratively, the first printed circuit board has mounting holes formed therein adjacent side edge portions thereof, and the first mounting means include these mounting holes, boss portions formed on the extender device and removably receivable in the mounting holes, and resilient tab portions of the extender device providing for a snap-fit connection between the extender device and the first printed circuit board and configured to engage the first printed circuit board and releasably retain the boss portions in the mounting holes.

Second mounting means are formed on the chassis wall and are configured to engage and operatively support on the chassis wall, in a parallel relationship therewith, the second printed circuit board which the foreshortened first printed circuit board replaces. With the extender device attached to the first printed circuit board, the thus enlarged first printed circuit board is attached to the chassis wall by operatively engaging the second mounting means with the extender device and the first printed circuit board in a manner operatively supporting the first printed circuit board on the chassis wall in a parallel relationship therewith.

In one illustrated version thereof, the second mounting means include mounting hook projections disposed on the chassis wall and received in corresponding slots formed in the first printed circuit board, and a board lock structure formed on the chassis wall and having a depressible latch portion releasably engaging an outer edge portion of the extender device to preclude an edgewise movement of the first printed circuit board that would permit withdrawal of the hook projections from the board slots.

In another illustrated version thereof, the second mounting means include mounting hook projections formed on the chassis wall and received in corresponding slots formed in the first printed circuit board, and a hollow cylindrical mounting boss formed on the chassis wall and secured to the extender device using a fastener member passing through the extender device and threaded into the mounting boss.

According to another feature of the present invention, an outer edge portion of the extender device is formed as a finger scoop structure defined by side-by-side oppositely curved arcuate sections. This finger scoop structure provides a convenient handling portion of the extender device that may be manually grasped to manipulate the first printed circuit board during its connection to and disconnection from the chassis wall.

BRIEF DESCRIPTION OF THE DRAWINGS

FIG. 2 is an enlarged scale perspective view of the extender device illustrating the manner in which it may be attached to a side edge portion of the circuit board illustrated in phantom in FIG. 2;

DETAILED DESCRIPTION

Figure 1:
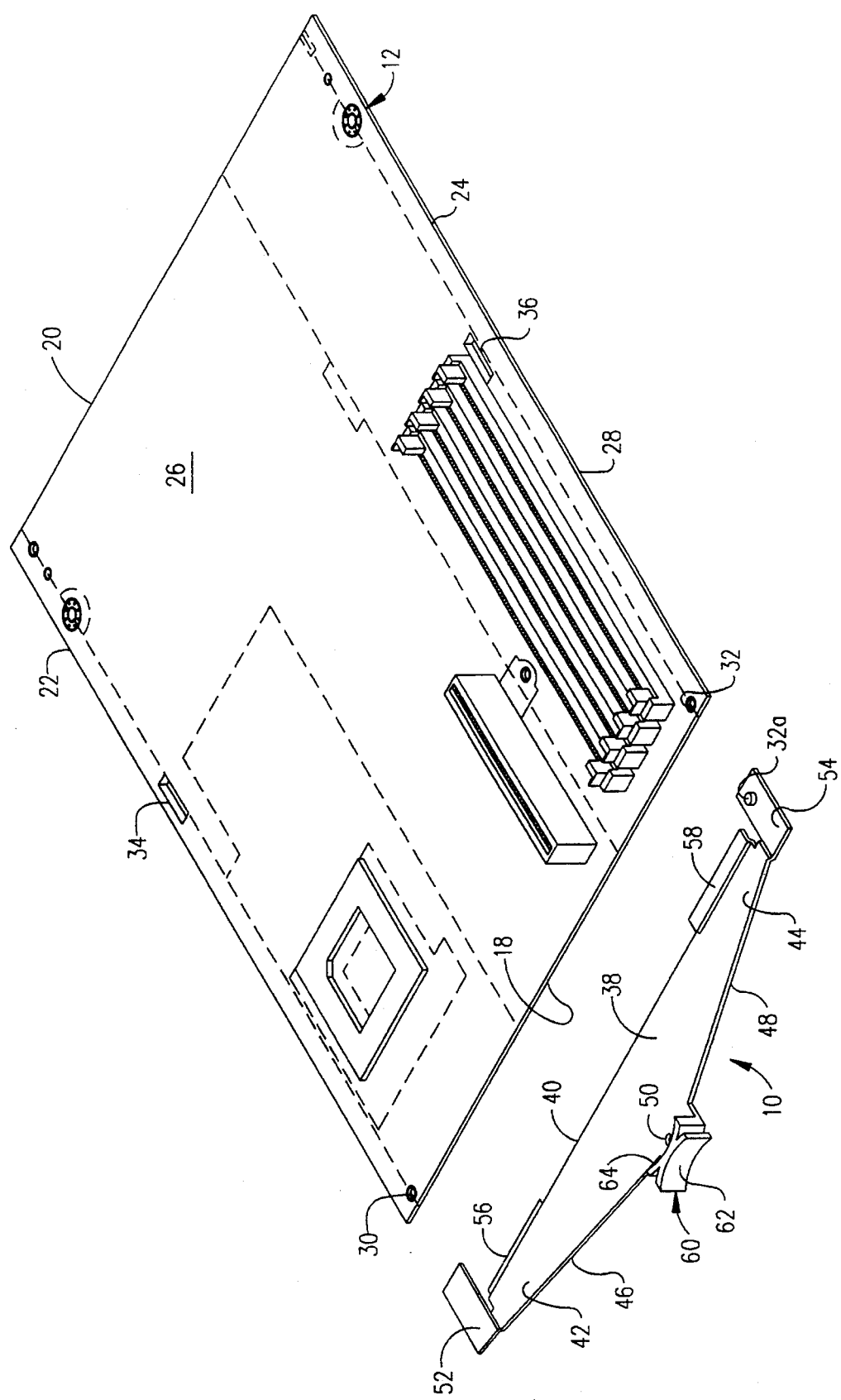
FIG. 1 is a perspective view of a representative printed circuit board and a specially designed extender device embodying principles of the present invention and used in conjunction with the circuit board to operatively mount it on a computer chassis.
Figure 2A:
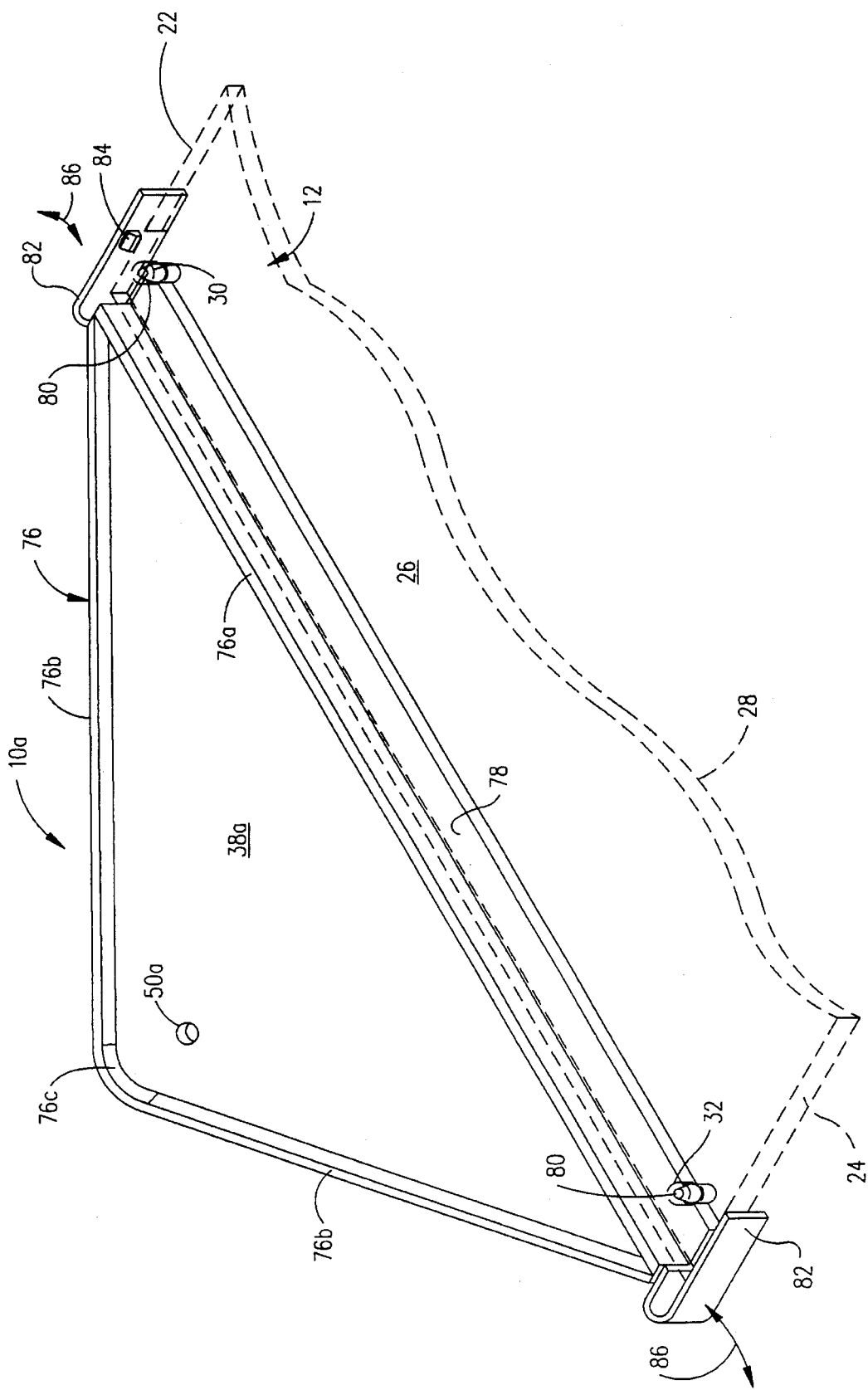
FIG. 2A is an enlarged scale perspective view of an alternate embodiment of the extender device illustrating the manner in which it may be attached to a side edge portion of the circuit board illustrated in phantom in FIG. 2A.
Figure 3:
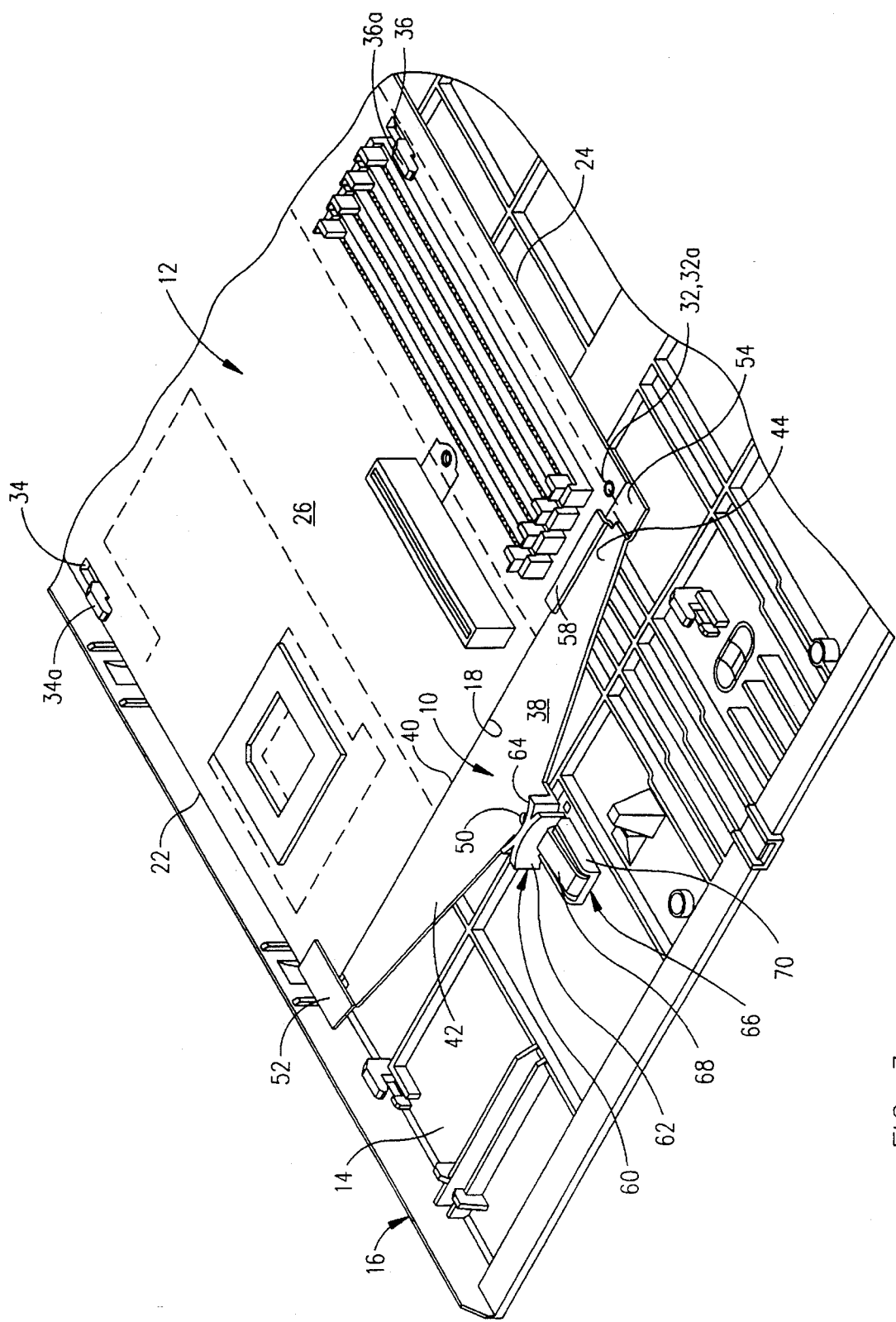
FIG. 3 is a perspective view illustrating a manner in which the FIG. 2 extender device may be used to operatively mount the circuit board to the chassis.

Referring initially to FIGS. 1–3, the present invention provides a specially designed adapter apparatus, representatively in the form of a generally plate-shaped molded plastic extender device 10. In a manner subsequently described herein, the extender device 10 is used to operatively connect a motherboard or other printed circuit board 12 on the board mounting structure of a wall portion 14 of a computer chassis 16, in place of a larger circuit board originally designed to be mounted on the chassis wall 14, without the previous necessity of altering the configuration of the chassis wall to accommodate the mounting of the smaller circuit board 12 thereon.

The reduced size circuit board 12 is representatively of an elongated rectangular configuration and has front and rear ends 18 and 20, opposite side edges 22 and 24, and top and bottom sides 26 and 28. For purposes of discussion, it will be assumed that the length of the circuit board 12 (i.e., the distance between its opposite ends 18, 20) is shorter than the length of the circuit board that the board 12 replaces. Circular tooling holes 30, 32 are respectively formed through left and right front corner portions of the circuit board 12, and an opposed pair of mounting slots 34, 36 are formed through the circuit board respectively adjacent its opposite side edges 22 and 24 rearwardly of the front board end 18. It should be understood that tooling holes 30, 32 may simply be mounting holes formed within the circuit board 12 for purposes of mounting the extender device 10.

The extender device 10 has an elongated, generally triangular body portion 38 having a straight rear or inner side edge 40, opposite end portions 42 and 44, and a pair of oppositely sloping outer side edge portions 46 and 48, and a mounting hole 50 inwardly adjacent the juncture of the side edge portions 46, 48. Mounting tabs 52, 54 are positioned on the left and right ends of the body 38, project rearwardly beyond the rear side edge 40 of the body, and are respectively offset in upward and downward directions relative to the balance of the body 38.

Upwardly and downwardly projecting cylindrical connection bosses 30a, 32a are respectively formed on the portions of the tabs 52, 54 that project rearwardly beyond the body side edge 40, and the distance between the bosses 30a, 32a is identical to the distance between the circuit board tooling holes 30, 32. Also respectively positioned on the opposite ends of the body 38, inwardly of the tabs 52 and 54, are a pair of mounting tabs 56 and 58 that respectively project downwardly and upwardly beyond the balance of the body 38 and project rearwardly beyond its inner side edge 40.

For purposes later described, a finger scoop structure 60 is molded onto the outer side edge of the extender device body 38 at the juncture of the oppositely sloping side edge portions 46 and 48. The finger scoop structure 60 comprises a side-to-side pair of oppositely curved portions 62, 64 that concavely face in forward and rearward directions, respectively.

As previously mentioned, the chassis wall 14 has formed thereon a board mounting structure which was originally configured to mount on the chassis 16 a printed circuit board longer than the illustrated printed circuit board 12. As best illustrated in FIG. 3, this board mounting structure representatively includes a pair of upwardly projecting mounting hook members 34a, 36a and a board lock structure 66 having a resiliently depressible latching portion 68 projecting upwardly from a body portion 70 of the lock structure. Both the hook members 34a, 36a and the lock structure 66 are of conventional configuration and operation.

Referring now to FIG. 2, the extender device 10 is operatively attached to the front end of the reduced length printed circuit board 12 by upwardly deflecting the rear end of the extender device end tab 52, downwardly deflecting the rear end of the end tab 54, inserting the front corner portions of the circuit board 12 into the spaces between the tab pairs 52, 56 and 54, 58, and then releasing the deflected tabs 52, 54 to permit the extender bosses 30a, 32a to respectively snap downwardly and upwardly into their associated circuit board tooling holes 30 and 32, thereby releasably locking the extender device 10 onto the front end of the printed circuit board 12 as illustrated in FIG. 2.

The printed circuit board 12 is then operatively installed on the chassis wall 14 by grasping the finger scoop structure 60, positioning the board slots 34, 36 over the hooks 34a, 36a, moving the circuit board downwardly to cause the hooks 34a, 36a to respectively pass upwardly through their associated board slots 34, 36, and then pushing the extender device 10 (and thus the circuit board 12) rearwardly to cause the board lock latch portion 68 to be depressed by the extender device 10 and then snap upwardly into releasable locking engagement with the finger scoop structure curved portion 62, as illustrated in FIG. 3, to thereby releasably lock the installed circuit board 12 on the existing mounting structure of the chassis wall 14.

In this manner, by using the extender device 10, the foreshortened printed circuit board 12 may be operatively installed on the chassis 16 without modifying the chassis in any manner. This, of course, advantageously eliminates the necessity of redesigning the chassis 16 every time a design improvement in the circuit board permits it to be of a smaller, less expensive size. In this event it is only necessary to provide another inexpensive molded plastic extender device appropriately configured to adapt the foreshortened circuit board to the existing board mounting structure on the chassis.

It should be noted that no tools are needed to secure the extender device 10 to the circuit board 12, and the molded-in finger scoop structure 60 provides a convenient place to hold the circuit board when installing it and removing it from the chassis 16. The finger scoop structure 60 could also provide additional EMI ground points for the circuit board by adding a simple metal strap or conductive paint to the scoop structure 60.

Figure 3A:
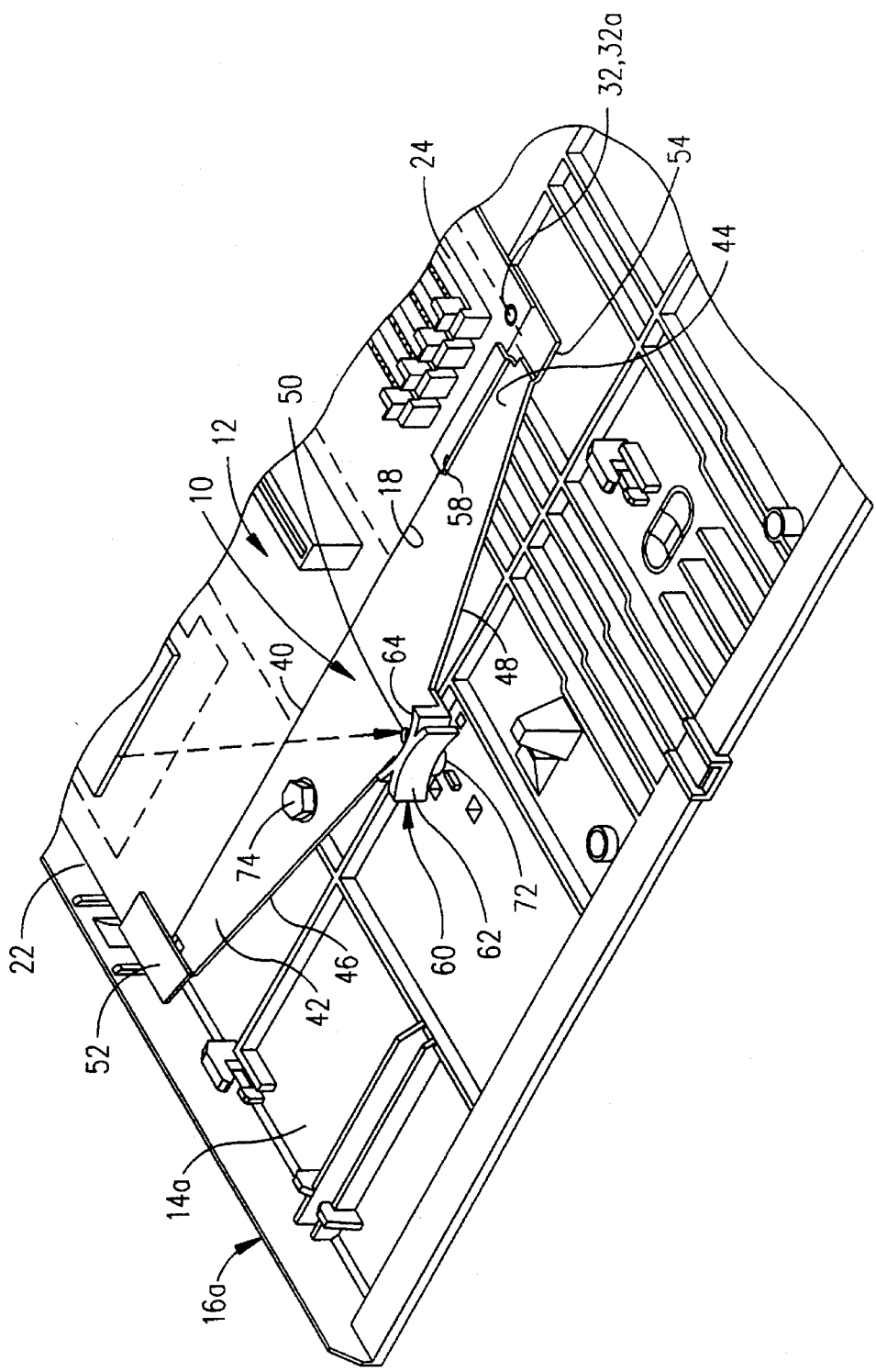
FIG. 3A is a perspective view illustrating an alternative manner in which the FIG. 2 extender device may be used to operatively mount the circuit board to the chassis.

As described above, the outer curved portion 62 of the finger scoop structure 60 forms an abutment surface for the latch portion 68 of the board lock structure 60 representatively shown in FIG. 3. However, the extender device 10 can be alternatively used in conjunction with conventional hollow cylindrical mounting boss portions of the chassis wall such as the boss 72 shown on the wall portion 14a of the chassis 16a shown in FIG. 3A and replacing the board lock structure 60 shown on the chassis wall 14 in FIG. 3. In this case, a mounting screw 74 is simply extended downwardly through the extender device mounting hole 50 and threaded into the boss 74 to releasably mount the extender device 10 and the foreshortened circuit board 12 on the chassis wall 14a.

An alternate embodiment 10a of the previously described molded plastic extender device 10 is illustrated in FIG. 2A and includes a generally triangular base wall 38a having an upstanding flange portion 76 around its periphery. The flange portion 76 has an inner side or base section 76a, and a pair of oppositely sloped outer side sections 76b meeting at an apex portion 76c outwardly adjacent a mounting hole 50a formed through the base wall 38a. Laterally extending rearwardly from a bottom portion of the base flange section 76a is an elongated mounting flange 78 having a pair of upstanding cylindrical bosses 80 at its opposite ends.

Bosses 80 are disposed inwardly of a pair of resilient, generally J-shaped tabs 82 formed on the outer ends of the flange section 76a. Free end portions of the tabs 82 extend rearwardly past the bosses 80 and have opposed locking projections 84 (only one of which is visible in FIG. 2A) on upper portions of their facing sides. To install the extender device 10a on the circuit board 12, the tabs 82 are outwardly bent, as indicated by the double-ended arrows 86 in FIG. 2A, the bosses 80 are passed upwardly through the circuit board tooling holes 30 and 32, and the tabs 82 are released to cause the locking projections 84 to snap back over the top side 26 of the circuit board 12, thereby releasably locking the modified extender device 10a to a peripheral portion of the foreshortened circuit board 12 is illustrated in FIG. 2A.

The circuit board 12 may then be installed on the chassis wall 14 (as previously described in conjunction with FIG. 3) by causing the apex section 76c of the flange portion 76 to depress and then abut the latch portion 68 of the board lock structure 66, or installed on the chassis wall 14a (as previously described in conjunction with FIG. 3A) by extending the screw 74 downwardly through the extender device mounting hole 50a and threading the screw into the mounting boss 72.

The foregoing detailed description is to be clearly understood as being given by way of illustration and example only, the spirit and scope of the present invention being limited solely by the appended claims.

What is claimed is:

1. Computer apparatus comprising:

a chassis having a wall portion;

a first printed circuit board;

an extender device;

first mounting means for releasably holding said extender device on said first printed circuit board in a manner such that said extender device forms an edgewise extension of said first printed circuit board; and second mounting means formed on said chassis wall portion and configured to engage and operatively support on said chassis wall portion, in a parallel orientation therewith, a second printed circuit board larger in an edgewise direction than said first printed circuit board, said second mounting means releasably engaging said extender device and said first printed circuit board in a manner operatively supporting said first printed circuit board on said chassis wall portion, in place of the second printed circuit board, in a parallel relationship with said chassis wall portion.

2. The computer apparatus of claim 1 wherein:

said printed circuit board is a motherboard.

3. The computer apparatus of claim 1 wherein said second mounting means include:

a spaced plurality of slots formed in said first printed circuit board, a spaced plurality of hook projections formed in said chassis wall portion and releasably received in said plurality of slots, an edge portions of said extender device, and a board lock structure formed on said chassis wall portion and having a depressible latch portion engaging said edge portion of said extender device to releasably prevent edgewise movement of said first printed circuit board in a manner permitting withdrawal of said hook projections through said slots.

4. The computer apparatus of claim 3 wherein:

said extender device has a generally plate shaped body portion, and said edge portion extends generally transversely to said body portion.

5. The computer apparatus of claim 4 wherein:

said edge portion defines a finger scoop section having side-by-side oppositely curved arcuate portions.

6. The computer apparatus of claim 1 wherein said second mounting means include:

a spaced plurality of slots formed in said first printed circuit board, a spaced plurality of hook projections formed on said chassis wall portion and releasably received in said plurality of slots, a hollow cylindrical mounting boss formed on said chassis portion and having an open end, an opening formed in said extender device and aligned with said open end of said mounting boss, and a threaded fastener extending through said extender device opening and threaded into said mounting boss.

7. The computer apparatus of claim 1 wherein:

said extender device has a generally plate shaped body portion with spaced apart first and second edge portions thereon, and said first mounting means include cooperating means on said extender device and said first printed circuit board for providing a releasable snap-fitted engagement between said first and second edge portions of said extender device and spaced apart first and second edge portions of said first printed circuit board.

8. The computer apparatus of claim 7 wherein said cooperating means include:

tooling holes formed in said first and second edge portions of said first printed circuit board, boss projections formed on said first and second edge portions of said extender device and releasably receivable in said tooling holes, and resilient tab members formed on said extender device and operative to releasably engage said first printed circuit board in a manner releasably retaining said boss projections in said tooling holes.

9. The computer apparatus of claim 8 wherein:

said boss projections are positioned to enter said tooling holes from opposite sides of said first printed circuit board, and said resilient tab members are positioned to engage the opposite sides of said first printed circuit board.

10. The computer apparatus of claim 8 wherein:

said boss projections are positioned to enter said tooling holes from a first side of said first printed circuit board, and said resilient tab members have portions positioned to engage said first printed circuit board from the opposite side thereof.

11. The computer apparatus of claim 1 wherein:

said extender device is a one piece plastic molding.

12. A method of operatively securing a first printed circuit board to a chassis wall in place of a second circuit board larger in an edgewise direction that said first printed circuit board, the chassis wall having disposed thereon mounting means configured to engage the second printed circuit board and secure it to the chassis wall, said method comprising the steps of:

providing a generally plate-shaped extender device;

releasably fastening an edge portion of said first printed circuit board in a manner such that said extender device forms an edgewise extension of said first printed circuit board;

operatively engaging a first portion of said mounting means with said first printed circuit board; and operatively engaging a second portions of said mounting means with said extender device.

13. The method of claim 12 wherein:

said step of releasably fastening an edge portion of said extender device to said first printed circuit board is performed by snap fitting spaced apart edge portions of said extender device to spaced apart peripheral portions of said first printed circuit board.

14. The method of claim 12 wherein:

said mounting means include a board lock structure having a depressible latch portion, and said step of operatively engaging a second portion of said mounting means with said extender device is performed by engaging an edge portion of said extender device with said depressible latch portion of said board lock structure.

15. The method of claim 12 wherein:

said mounting means include a hollow cylindrical mounting boss, and said step of operatively engaging a second portion of said mounting means with said extender device is performed by extending a threaded fastener through said extender device and threading said fastener into said mounting boss.

\* \* \* \* \*